US012698843B2

(12) United States Patent
Römer et al.

(10) Patent No.: US 12,698,843 B2
(45) Date of Patent: Aug. 4, 2026

(54) SYSTEMS AND METHODS FOR PIEZO VALVES

(71) Applicant: Aventics GMBH, Laatzen (DE)

(72) Inventors: Sascha Römer, Hannover (DE); Marc Mueller, Maulbronn (DE)

(73) Assignee: Aventics GmbH, Laatzen (DE)

( * ) Notice: Subject to any disclaimer, the term of this patent is extended or adjusted under 35 U.S.C. 154(b) by 314 days.

(21) Appl. No.: 18/481,187

(22) Filed: Oct. 4, 2023

(65) Prior Publication Data

US 2024/0110635 A1 Apr. 4, 2024

(30) Foreign Application Priority Data

Oct. 4, 2022 (DE) ..................... 10 2022 125 517.4

(51) Int. Cl.
| | |
|---|---|
| *F16K 31/00* | (2006.01) |
| *F16K 11/02* | (2006.01) |
| *F16K 27/02* | (2006.01) |
| *F16K 31/06* | (2006.01) |
| *H10N 30/03* | (2023.01) |
| *H10N 30/20* | (2023.01) |

(52) U.S. Cl.
CPC .......... *F16K 31/006* (2013.01); *F16K 11/022* (2013.01); *F16K 27/029* (2013.01); *F16K 31/0675* (2013.01); *H10N 30/03* (2023.02); *H10N 30/2042* (2023.02)

(58) Field of Classification Search
CPC .. F16K 31/006; F16K 31/0675; F16K 11/022; F16K 27/029; H10N 30/03; H10N 30/2042

USPC ...................................................... 251/129.06
See application file for complete search history.

(56) References Cited

U.S. PATENT DOCUMENTS

| | | | | |
|---|---|---|---|---|
| 2,478,223 A | * | 8/1949 | Argabrite | H04R 17/00 |
| | | | | 29/25.35 |
| 3,029,743 A | * | 4/1962 | Johns | F04B 43/095 |
| | | | | 417/322 |
| 4,194,194 A | * | 3/1980 | Redfern | G08B 13/169 |
| | | | | 310/345 |
| 4,450,375 A | * | 5/1984 | Siegal | F16K 31/006 |
| | | | | 310/330 |
| 4,492,360 A | * | 1/1985 | Lee, II | F16K 31/006 |
| | | | | 251/285 |
| 4,617,952 A | * | 10/1986 | Fujiwara | F15B 5/003 |
| | | | | 137/625.45 |

(Continued)

FOREIGN PATENT DOCUMENTS

| | | |
|---|---|---|
| CN | 206148471 U | 8/2016 |
| DE | 69706919 T2 | 4/2002 |

*Primary Examiner* — William M McCalister
(74) *Attorney, Agent, or Firm* — Mackey Law Firm PLLC

(57) ABSTRACT

A method for assembling a piezo valve can include providing a cable having first and second contacts, forming a pocket between the first and second contacts, inserting at least a portion of a piezo element into the pocket, electrically coupling the first contact to a first layer of the piezo element, and electrically coupling the second contact to a second layer of the piezo element. Forming the pocket between the first and second contacts can include moving the second contact from a first position, in which the first and second contacts can be coplanar, to a second position, in which the first and second contacts can be disposed in different planes.

20 Claims, 15 Drawing Sheets

(56) References Cited

U.S. PATENT DOCUMENTS

| | | | | |
|---|---|---|---|---|
| 4,629,926 A * | 12/1986 | Siegal | F16K 31/004 | 310/330 |
| 4,705,059 A * | 11/1987 | Lecerf | F15B 13/0438 | 137/625.61 |
| 4,708,600 A * | 11/1987 | AbuJudom, II | F04B 43/046 | 417/418 |
| 4,771,204 A * | 9/1988 | Siegal | F16K 31/006 | 310/330 |
| 4,787,071 A * | 11/1988 | Kreuter | G05D 16/2013 | 60/381 |
| 4,903,732 A * | 2/1990 | Allen | F16K 31/005 | 137/625.65 |
| 4,934,401 A * | 6/1990 | Ikehata | F16K 31/006 | 251/129.06 |
| 5,079,472 A * | 1/1992 | Uhl | H10N 30/2047 | 310/330 |
| 5,593,134 A * | 1/1997 | Steber | F02M 59/466 | 251/129.08 |
| 5,630,440 A * | 5/1997 | Knutson | F02M 59/468 | 137/554 |
| 5,761,782 A * | 6/1998 | Sager | H10N 30/08 | 29/25.35 |
| 5,779,218 A * | 7/1998 | Kowanz | F15B 5/003 | 251/129.06 |
| 5,847,490 A * | 12/1998 | Kumasaka | H10N 30/883 | 310/345 |
| 6,024,340 A * | 2/2000 | Lazarus | F16K 31/004 | 310/365 |
| 6,173,744 B1 * | 1/2001 | Frisch | F16K 31/006 | 137/625.65 |
| 6,581,638 B2 * | 6/2003 | Frisch | F16K 31/004 | 137/596.17 |
| 7,322,376 B2 * | 1/2008 | Frisch | F16K 31/006 | 137/625.5 |
| 7,518,289 B2 * | 4/2009 | Kobayashi | H10N 30/2042 | 310/353 |
| 7,520,487 B2 * | 4/2009 | Mattes | F16K 31/402 | 251/30.02 |
| 8,556,227 B2 * | 10/2013 | Buestgens | F16K 31/006 | 310/326 |
| 8,631,825 B2 * | 1/2014 | Lee | F16K 31/006 | 137/884 |
| 8,979,065 B2 * | 3/2015 | Zhelyaskov | F16K 31/004 | 310/357 |
| 9,423,044 B2 * | 8/2016 | Im | F16K 31/006 | |
| 2003/0222236 A1 * | 12/2003 | Eberhardt | F16K 31/006 | 251/129.06 |
| 2004/0177890 A1 * | 9/2004 | Weinmann | F16K 31/006 | 137/625.65 |
| 2004/0232371 A1 * | 11/2004 | Bayer | F16K 11/22 | 251/129.06 |
| 2005/0199301 A1 * | 9/2005 | Frisch | F16K 31/006 | 137/625.65 |
| 2009/0032746 A1 * | 2/2009 | Smith | F15B 13/0433 | 251/30.02 |
| 2015/0325777 A1 * | 11/2015 | Irie | H10N 30/88 | 347/50 |
| 2016/0118573 A1 * | 4/2016 | Palermo | H10N 30/202 | 310/311 |
| 2021/0095777 A1 * | 4/2021 | Schaible | F16K 31/124 | |
| 2022/0406987 A1 * | 12/2022 | Wu | F16K 31/006 | |
| 2023/0051761 A1 * | 2/2023 | Tani | H10N 30/02 | |
| 2024/0117862 A1 * | 4/2024 | Chang | F16K 31/006 | |

* cited by examiner

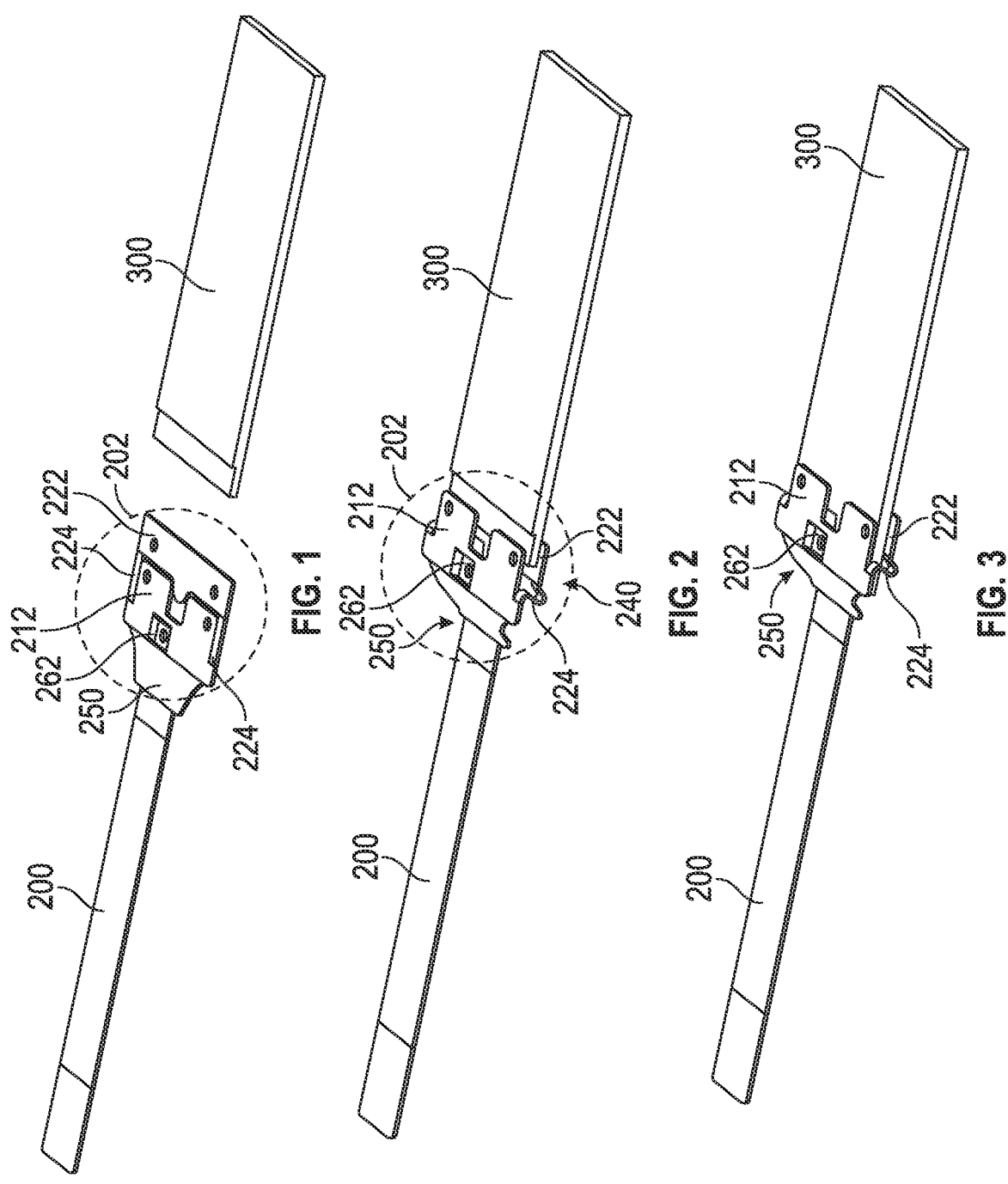

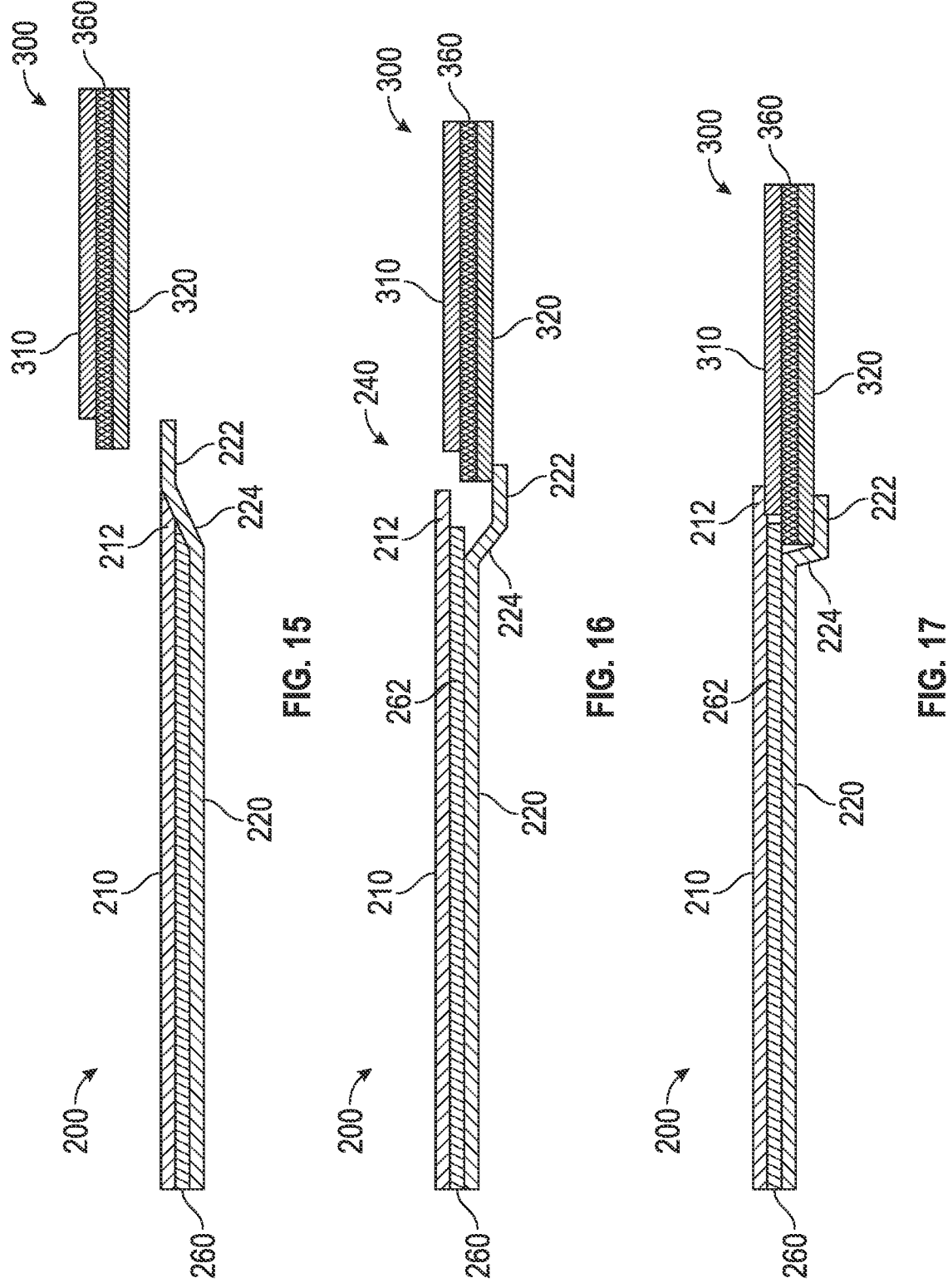

SYSTEMS AND METHODS FOR PIEZO VALVES

CROSS REFERENCE TO RELATED APPLICATIONS

This application claims the benefit of German patent application number 10 2022 125 517.4 filed Oct. 4, 2022, the entire contents of which are incorporated herein by reference.

STATEMENT REGARDING FEDERALLY SPONSORED RESEARCH OR DEVELOPMENT

Not applicable.

REFERENCE TO APPENDIX

Not applicable.

BACKGROUND OF THE INVENTION

Field of the Invention

The present disclosure relates generally to electrically actuated valves and more specifically relates to piezo valves.

Description of the Related Art

Low power valves actuated by piezo benders are known. However, current designs can suffer from shortcomings, such as being difficult or time consuming to assemble, for example. A need exists in the art for improved devices, systems and methods for piezo valves and the manufacture thereof.

BRIEF SUMMARY OF THE INVENTION

Applicants have created new and useful devices, systems and methods for piezo valves.

In at least one embodiment, a method for assembling a piezo valve can include providing a cable having first and second contacts, forming a pocket between the first and second contacts, inserting at least a portion of a piezo element into the pocket, electrically coupling the first contact to a first layer of the piezo element, electrically coupling the second contact to a second layer of the piezo element, or any combination thereof. In at least one embodiment, the cable can have first and second conductors in electrical communication with the first and second contacts.

In at least one embodiment, forming the pocket between the first and second contacts can include moving the second contact from a first position to a second position. In at least one embodiment, the first and second contacts can be coplanar in the first position. In at least one embodiment, the first and second contacts can be disposed in different planes in the second position. In at least one embodiment, forming the pocket further can include bending an arm electrically coupled between the second conductor and the second contact.

In at least one embodiment, the second layer of the piezo element can oppose the first layer. In at least one embodiment, inserting at least a portion of the piezo element can comprise sliding the piezo element between and/or parallel to the first and/or second contacts. In at least one embodiment, electrically coupling the first contact to the first layer and/or electrically coupling the second contact to the second layer can include soldering the first contact to the first layer and/or soldering the second contact to the second layer.

In at least one embodiment, a method for assembling a piezo valve can include disposing the piezo element within a housing of the piezo valve, routing an end of the cable for electrical communication with a power source, contacting a stop surface with the cable, bending a portion of the cable disposed between the stop surface and at least one of the first and second contacts, thereby creating a biasing portion of the cable, or any combination thereof. In at least one embodiment, a method for assembling a piezo valve can include disposing at least a portion of one of the first and second contacts between the stop surface and one or more stops disposed within the housing and/or biasing at least one of the first and second contacts towards the one or more stops with the biasing portion of the cable. In at least one embodiment, a method for assembling a piezo valve can include biasing the piezo element away from the stop surface with the biasing portion of the cable and/or electrically coupling at least one of the first and second contacts to the piezo element while the piezo element is biased away from the stop surface. In at least one embodiment, a method for assembling a piezo valve can include biasing the second contact into a rest position against the one or more stops. In at least one embodiment, a method for assembling a piezo valve can include electrically coupling a third contact of the cable to an inner layer of the piezo element.

In at least one embodiment, a piezo valve system can include a piezo element having a first layer and a second layer, a connector having a first contact and a second contact, a cable having a first conductor electrically coupled to the first contact and a second conductor electrically coupled to the second contact, or any combination thereof. In at least one embodiment, the second layer can oppose the first layer. In at least one embodiment, the piezo element can deform along its length when a voltage difference is applied across the layers. In at least one embodiment, the second contact can move from an initial position to a final position. In at least one embodiment, the first and second contacts can be coplanar in the initial position. In at least one embodiment, the first and second contacts can be disposed in different planes, with a pocket there between, in the final position. In at least one embodiment, at least a portion of the piezo element can be disposed within the pocket of the connector with the first contact in electrical communication with the first layer and the second contact in electrical communication with the second layer.

In at least one embodiment, the connector and the cable can be integral parts of a unitary foil cable. In at least one embodiment, the piezo element can be a ceramic piezo bender. In at least one embodiment, the piezo element can include an inner layer between the first layer and the second layer. In at least one embodiment, the connector can include a third contact, which can be electrically coupled to a third conductor of the cable. In at least one embodiment, the third contact of the connector can be electrically coupled to the inner layer of the piezo element when the portion of the piezo element is disposed within the pocket of the connector. In at least one embodiment, the connector can include at least one arm electrically coupled to the second conductor and the second contact. In at least one embodiment, the at least one arm can be disposed adjacent to a side of the piezo element. In at least one embodiment, the piezo element can be soldered to the first and second contacts within the pocket. In at least one embodiment, the cable can include a biasing portion to bias the piezo element in at least one direction.

In at least one embodiment, a piezo valve system can include a housing, a support configured to support at least one of the piezo element and the connector, a stop surface disposed within the housing, or any combination thereof. In at least one embodiment, the piezo element can be disposed within the housing and/or supported by the support, with the cable in physical contact with the stop surface. In at least one embodiment, the housing can have at least two ports. In at least one embodiment, the housing can house the piezo element in selective sealing communication with at least one of the ports. In at least one embodiment, a portion of the cable disposed between the stop surface and the support can be bent into a biasing portion of the cable. In at least one embodiment, the biasing portion can bias the piezo element away from the stop surface.

In at least one embodiment, a piezo valve system can include one or more stops disposed within the housing. In at least one embodiment, the biasing portion of the cable can bias at least a portion of the piezo element towards the one or more stops. In at least one embodiment, the biasing portion of the cable can bias at least a portion of the connector towards the one or more stops. In at least one embodiment, the biasing portion of the cable can bias at least a portion of the connector towards the one or more stops disposed on a side of the housing opposite a stop surface. In at least one embodiment, the biasing portion of the cable can bias at least a portion of the connector into physical contact with at least one of the one or more stops. In at least one embodiment, the biasing portion of the cable, the stop surface and the one or more stops can cooperate to hold the connector and the piezo element in place within the housing.

In at least one embodiment, an electrical cable for a piezo bender can include a first conductor electrically coupled to a first contact and a second conductor electrically coupled to a second contact. In at least one embodiment, the first conductor and the first contact can be electrically insulated from the second conductor and the second contact. In at least one embodiment, the first and second contacts can have a first position and a second position. In at least one embodiment, the first and second contacts can be coplanar in the first position. In at least one embodiment, the first and second contacts can be disposed in different planes in the second position.

In at least one embodiment, at least one of the first and second contacts can be configured to be plastically deformed relative to the other of the first and second contacts. In at least one embodiment, the first and second contacts can be configured to form a pocket therebetween, such as when the first and second contacts are in the second position. In at least one embodiment, the piezo bender can have a first portion and a second portion. In at least one embodiment, the pocket can receive at least the first portion of the piezo bender, such as to support electrical communication between the first and second contacts and one or more layers of the piezo bender.

BRIEF DESCRIPTION OF THE SEVERAL VIEWS OF THE DRAWINGS

FIG. 1 is a first perspective view of one of many embodiments of select components of a piezo valve assembly according to the disclosure.

FIG. 2 is a second perspective view of one of many embodiments of select components of a piezo valve assembly according to the disclosure.

FIG. 3 is a third perspective view of one of many embodiments of select components of a piezo valve assembly according to the disclosure.

FIG. 15 is a first side elevation view of one of many embodiments of select components of a piezo valve assembly according to the disclosure.

FIG. 16 is a second side elevation view of one of many embodiments of select components of a piezo valve assembly according to the disclosure.

FIG. 17 is a third side elevation view of one of many embodiments of select components of a piezo valve assembly according to the disclosure.

DETAILED DESCRIPTION OF THE INVENTION

Figures 4, 5, 6:
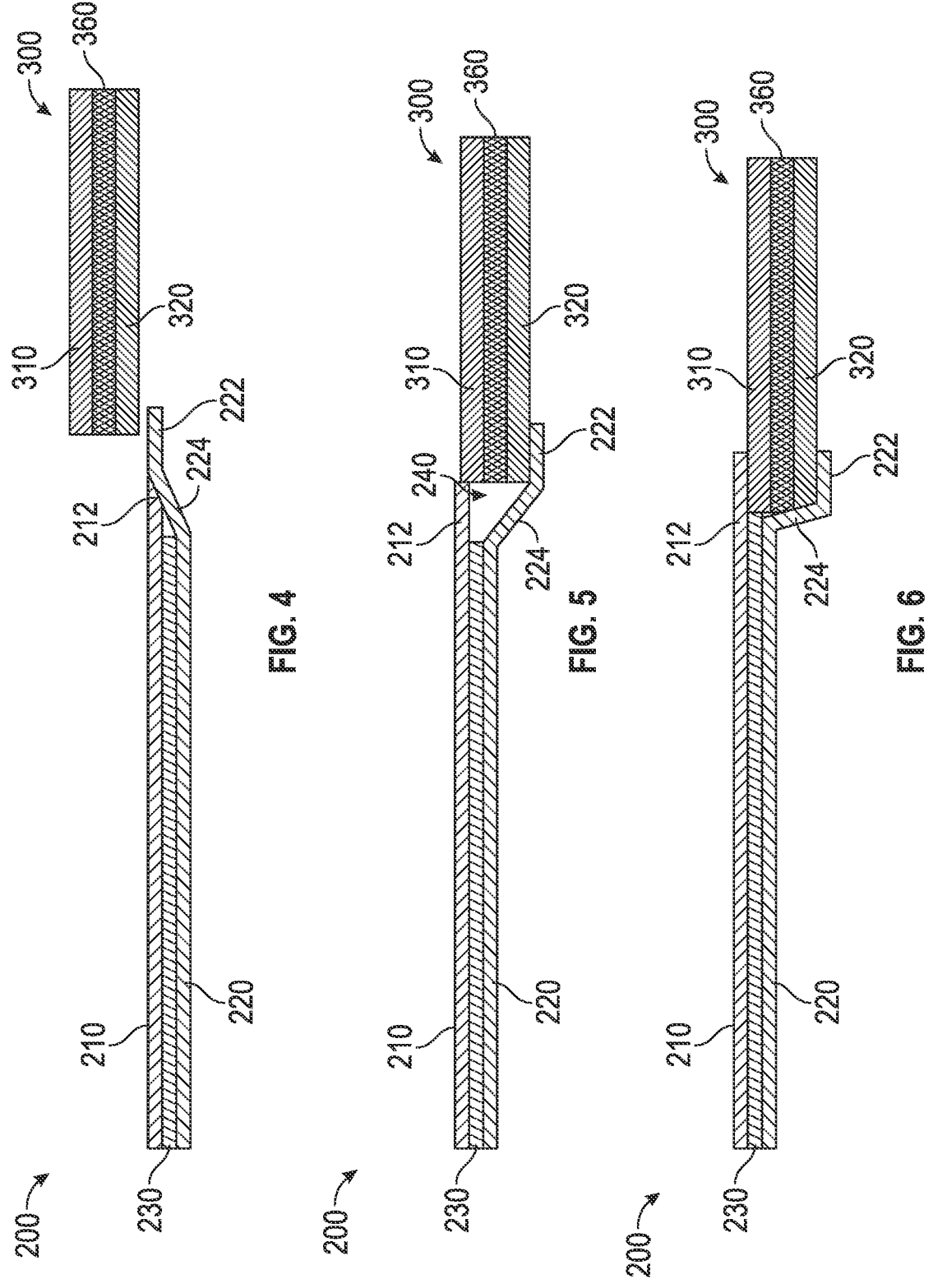
FIG. 4 is a first side elevation view of one of many embodiments of select components of a piezo valve assembly according to the disclosure.
FIG. 5 is a second side elevation view of one of many embodiments of select components of a piezo valve assembly according to the disclosure.
FIG. 6 is a third side elevation view of one of many embodiments of select components of a piezo valve assembly according to the disclosure.

The Figures described above and the written description of specific structures and functions below are not presented to limit the scope of what Applicants have invented or the scope of the appended claims. Rather, the Figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms.

The use of a singular term, such as, but not limited to, "a," is not intended as limiting of the number of items. Also, the use of relational terms, such as, but not limited to, "top," "bottom," "left," "right," "upper," "lower," "down," "up," "side," and the like are used in the written description for clarity in specific reference to the Figures and are not intended to limit the scope of the inventions or the appended claims. The terms "including" and "such as" are illustrative and not limitative. The terms "couple," "coupled," "coupling," "coupler," and like terms are used broadly herein and can include any method or device for securing, binding, bonding, fastening, attaching, joining, inserting therein, forming thereon or therein, communicating, or otherwise associating, for example, mechanically, magnetically, electrically, chemically, operably, directly or indirectly with intermediate elements, one or more pieces of members together and can further include without limitation integrally forming one functional member with another in a unity fashion. The coupling can occur in any direction, including rotationally. Further, all parts and components of the disclosure that are capable of being physically embodied inherently include imaginary and real characteristics regardless of whether such characteristics are expressly described herein, including but not limited to characteristics such as axes, ends, inner and outer surfaces, interior spaces, tops, bottoms, sides, boundaries, dimensions (e.g., height, length, width, thickness), mass, weight, volume and density, among others.

Process flowcharts discussed herein illustrate the operation of possible implementations of systems, methods, and computer program products according to various embodiments of the present invention. In this regard, each block in the flowchart may represent a module, segment, or portion of code, which comprises one or more executable instructions for implementing the specified logical function(s). It should also be noted that, in some alternative implementations, the functions noted in the blocks can occur out of the order depicted in the figures. For example, blocks shown in succession can, in at least some embodiments, be executed substantially concurrently. Further, in at least one embodiment, one or more blocks of a flowchart illustration can be implemented in whole or in part by special purpose hardware-based systems that perform the specified functions or acts, or combinations of special purpose hardware and computer instructions.

Figure 7:
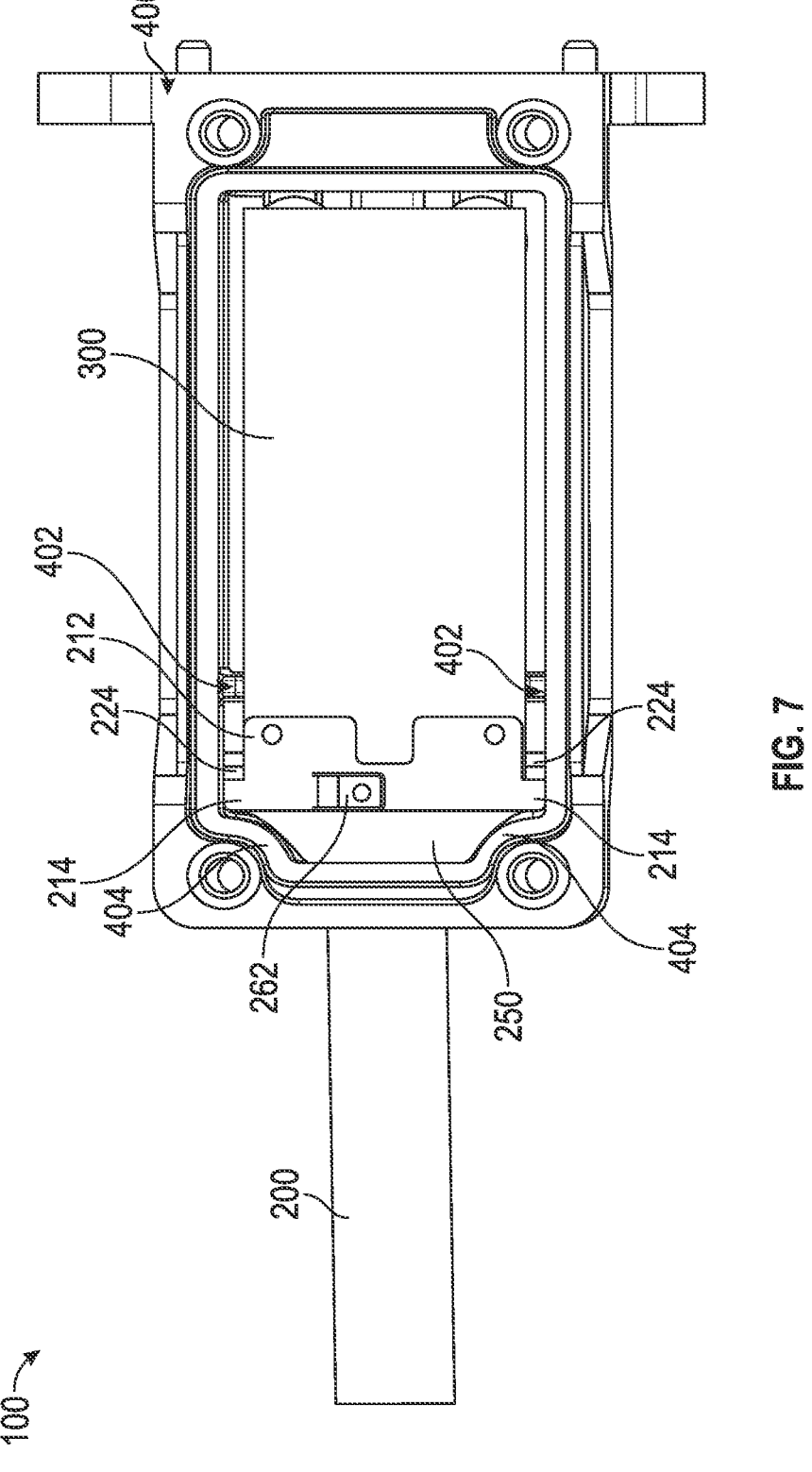
FIG. 7 is a plan view of one of many embodiments of select components of a piezo valve assembly according to the disclosure.
Figure 8:
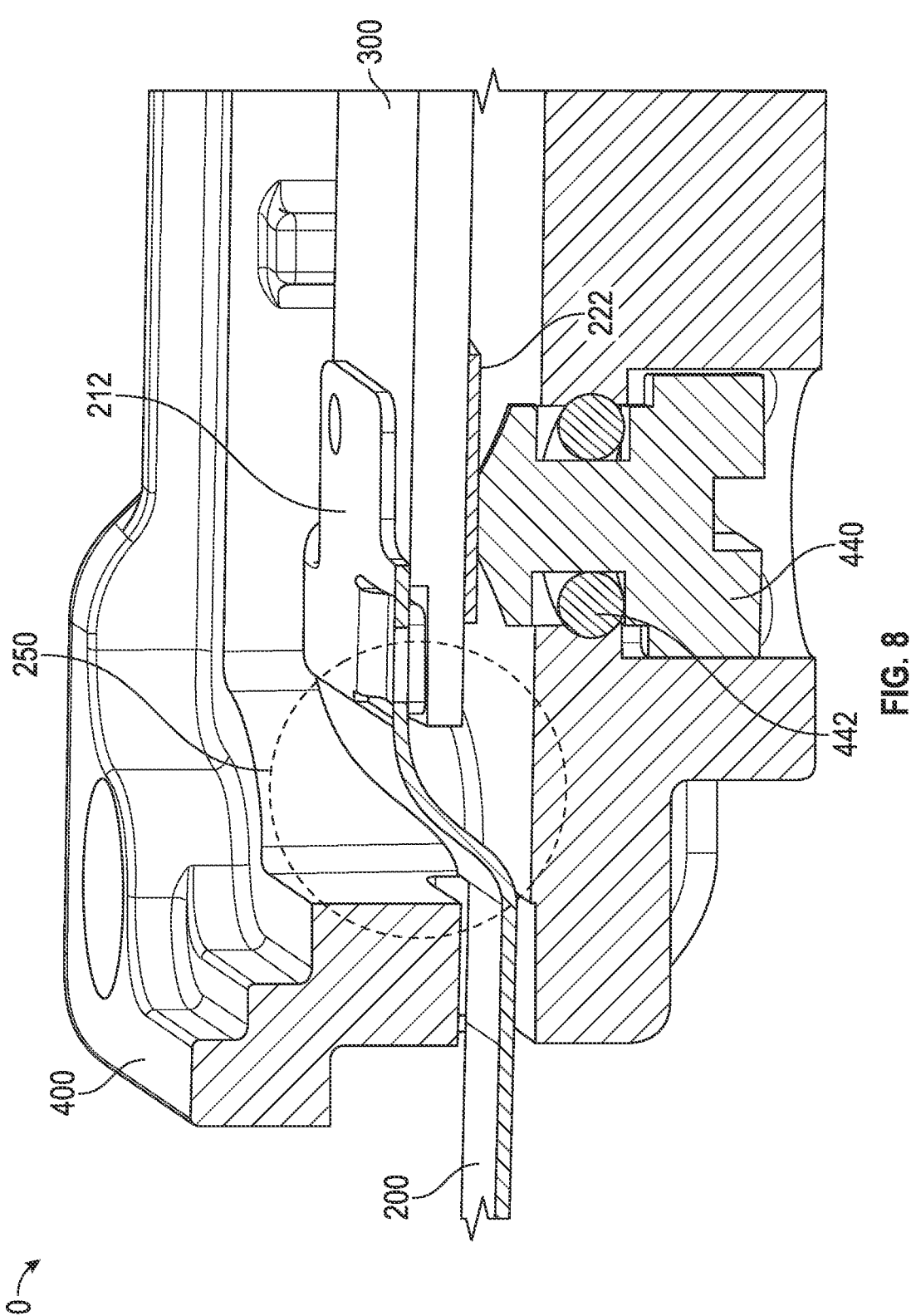
FIG. 8 is a first sectional perspective view of one of many embodiments of select components of a piezo valve assembly according to the disclosure.
Figure 9:
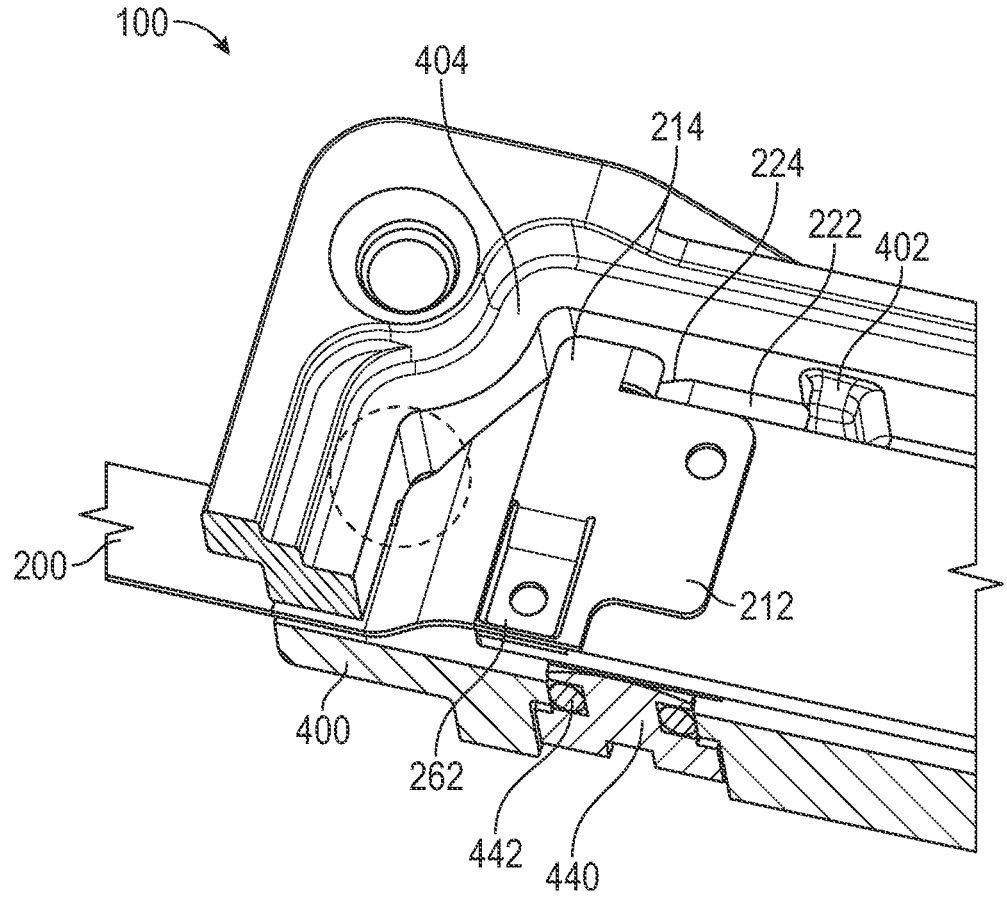
FIG. 9 is a second sectional perspective view of one of many embodiments of select components of a piezo valve assembly according to the disclosure.
Figure 10:
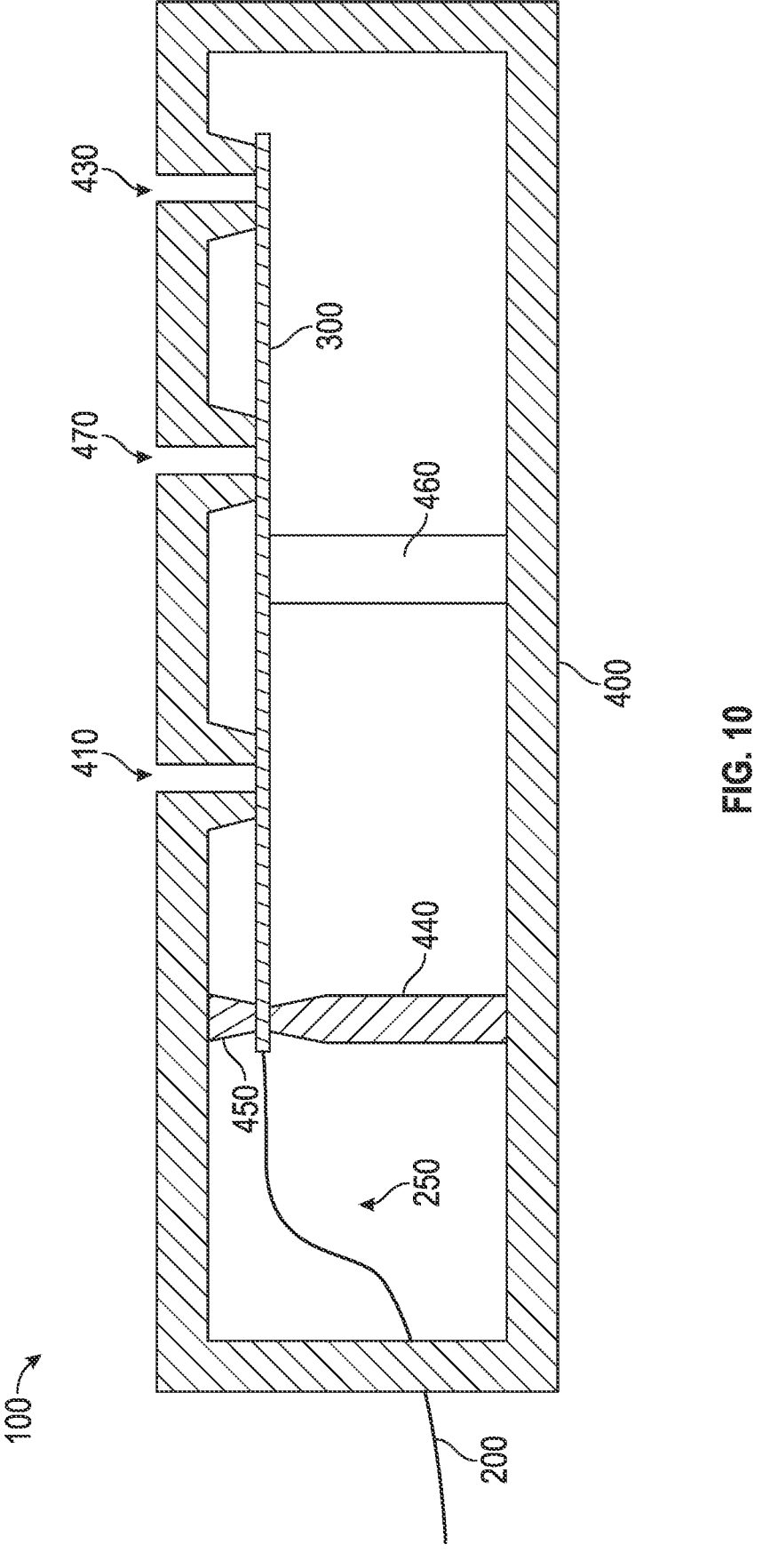
FIG. 10 is a first sectional schematic view of one of many embodiments of select components of a piezo valve assembly according to the disclosure.
Figure 11:
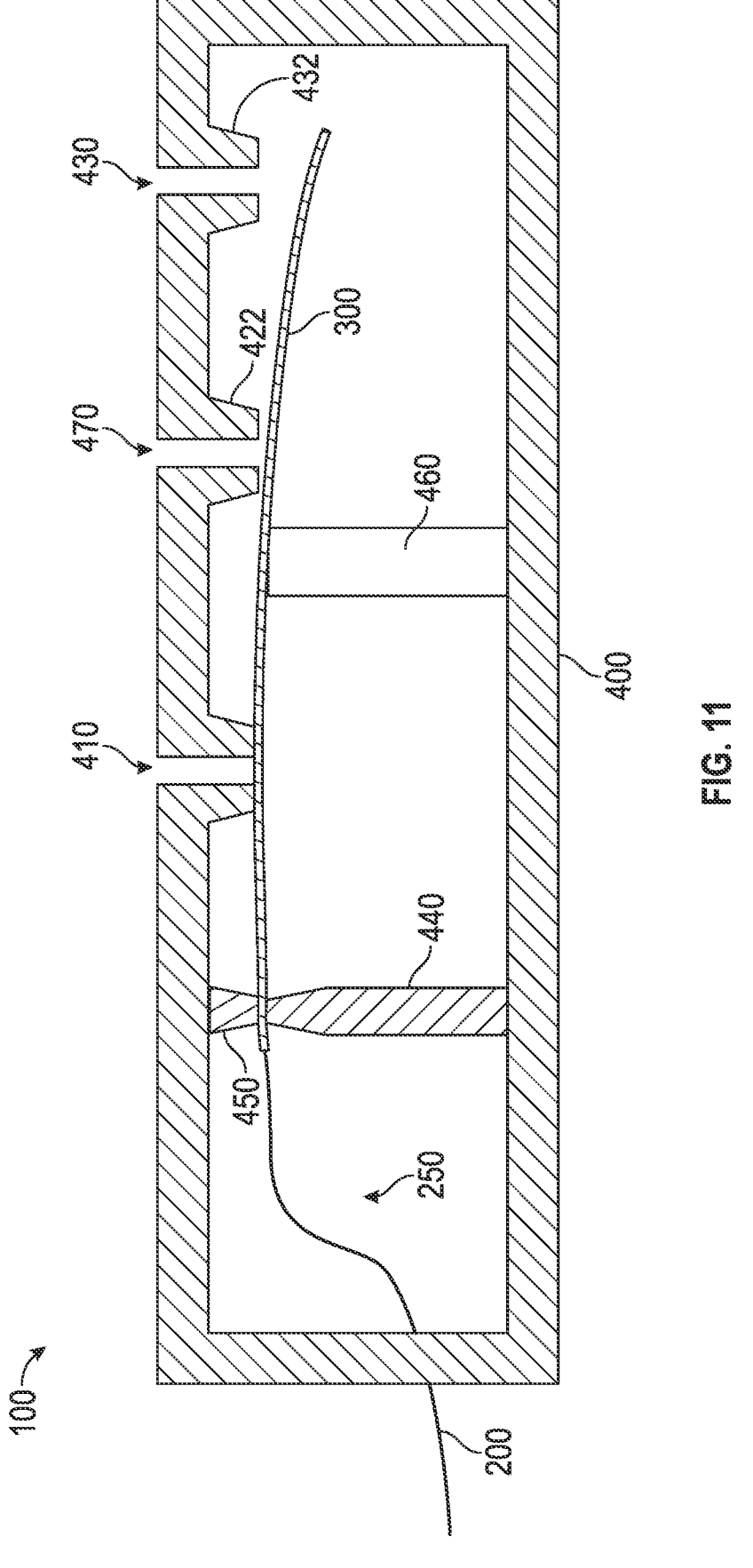
FIG. 11 is a second sectional schematic view of one of many embodiments of select components of a piezo valve assembly according to the disclosure.
Figure 12:
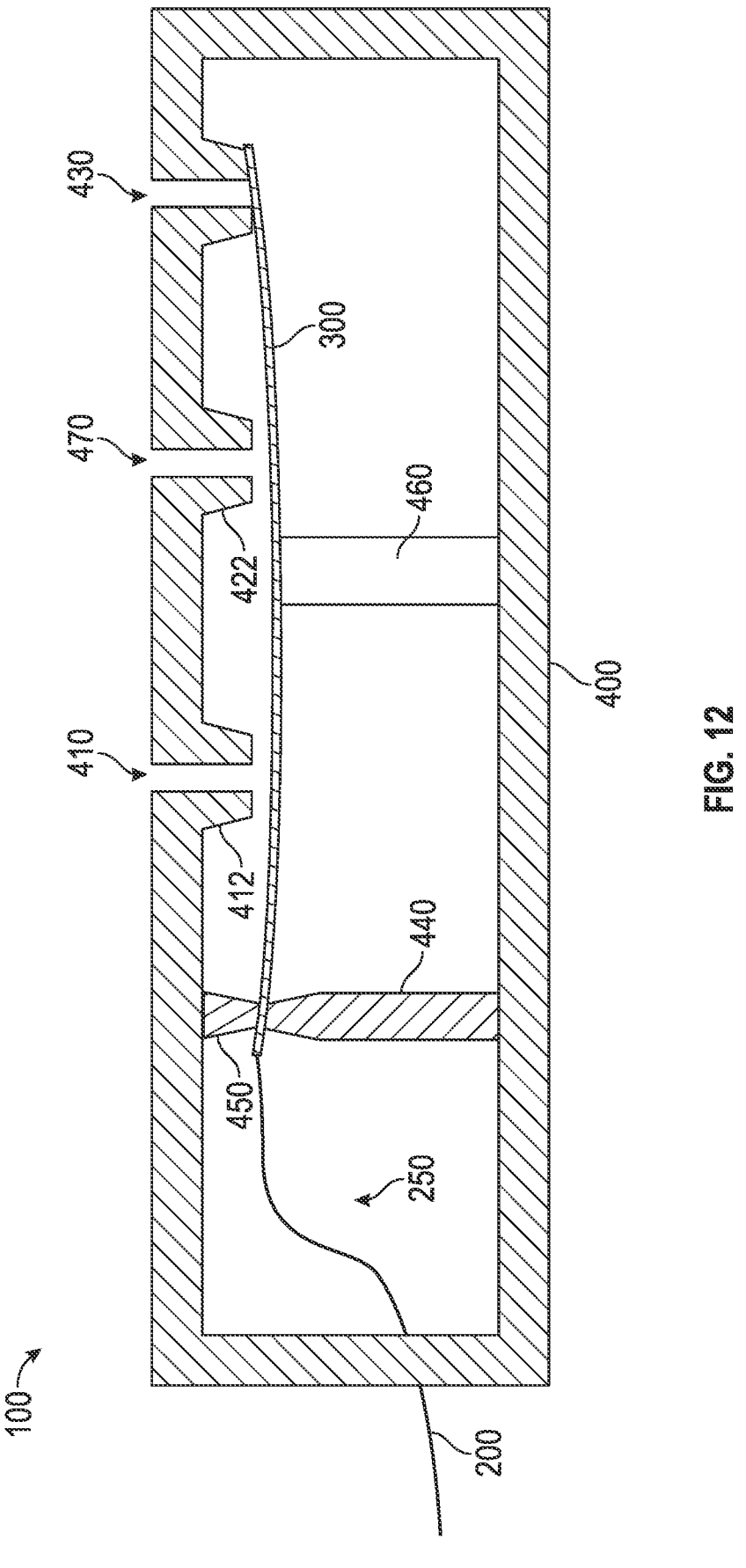
FIG. 12 is a third sectional schematic view of one of many embodiments of select components of a piezo valve assembly according to the disclosure.
Figure 13:
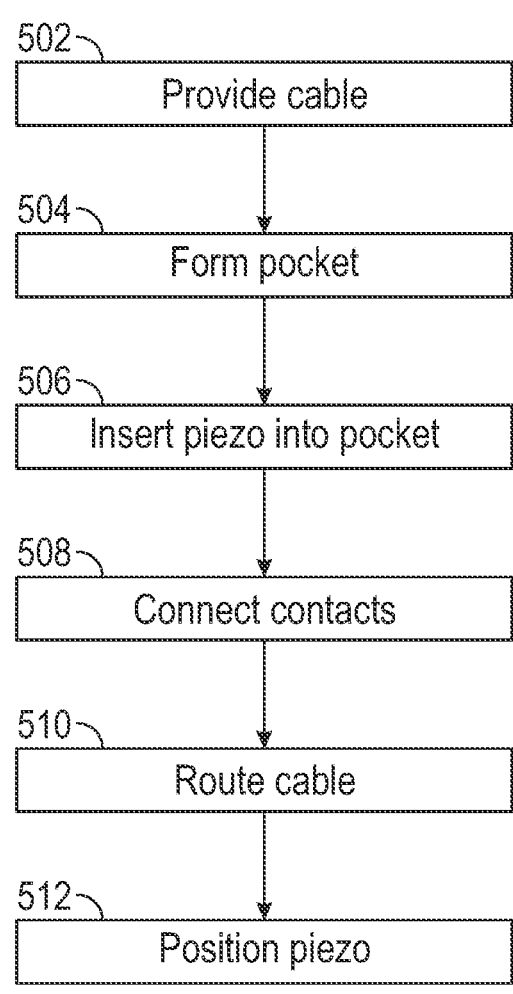
FIG. 13 is a flow chart of one of many embodiments of a method of assembling a piezo valve according to the disclosure.
Figure 14:
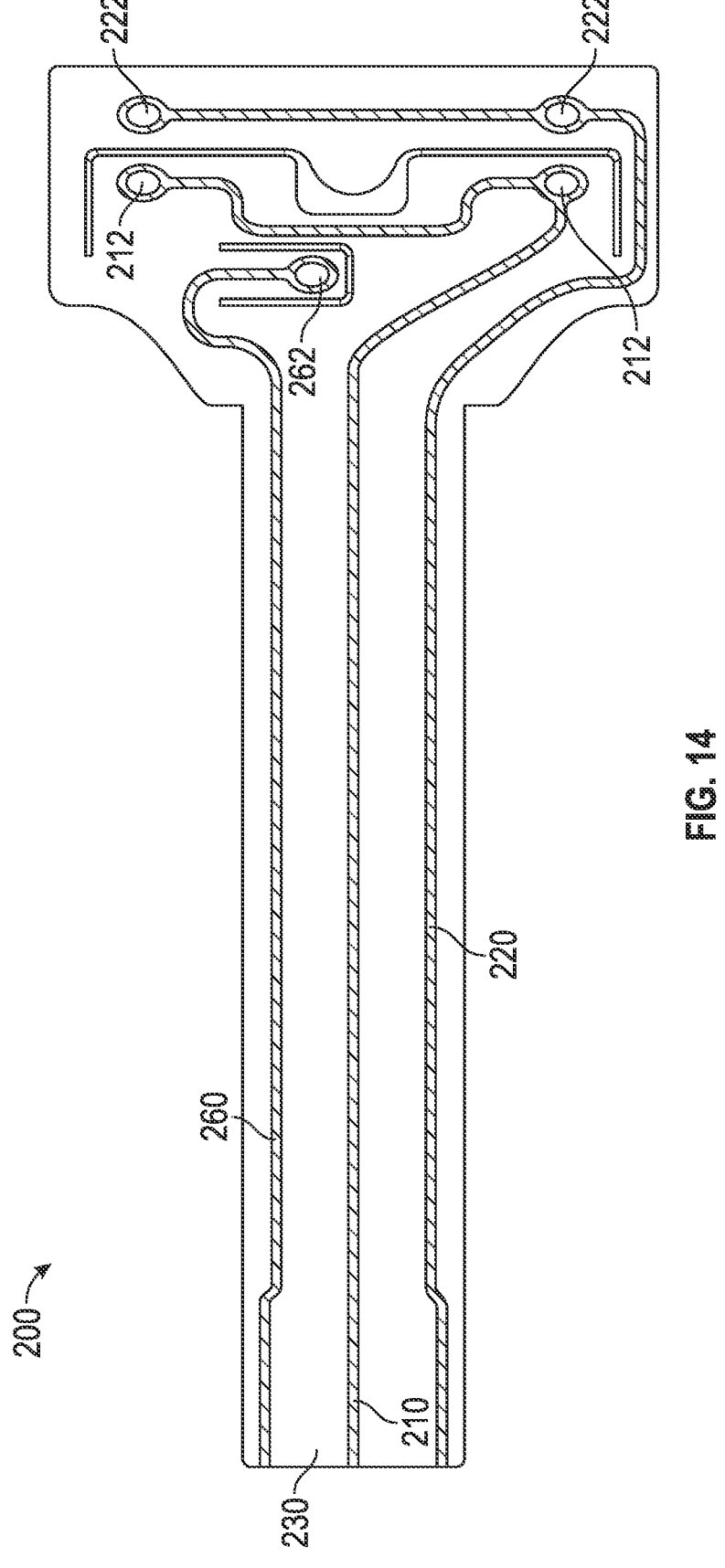
FIG. 14 is a plan view of one of many embodiments of a cable assembly according to the disclosure.
Figure 18:
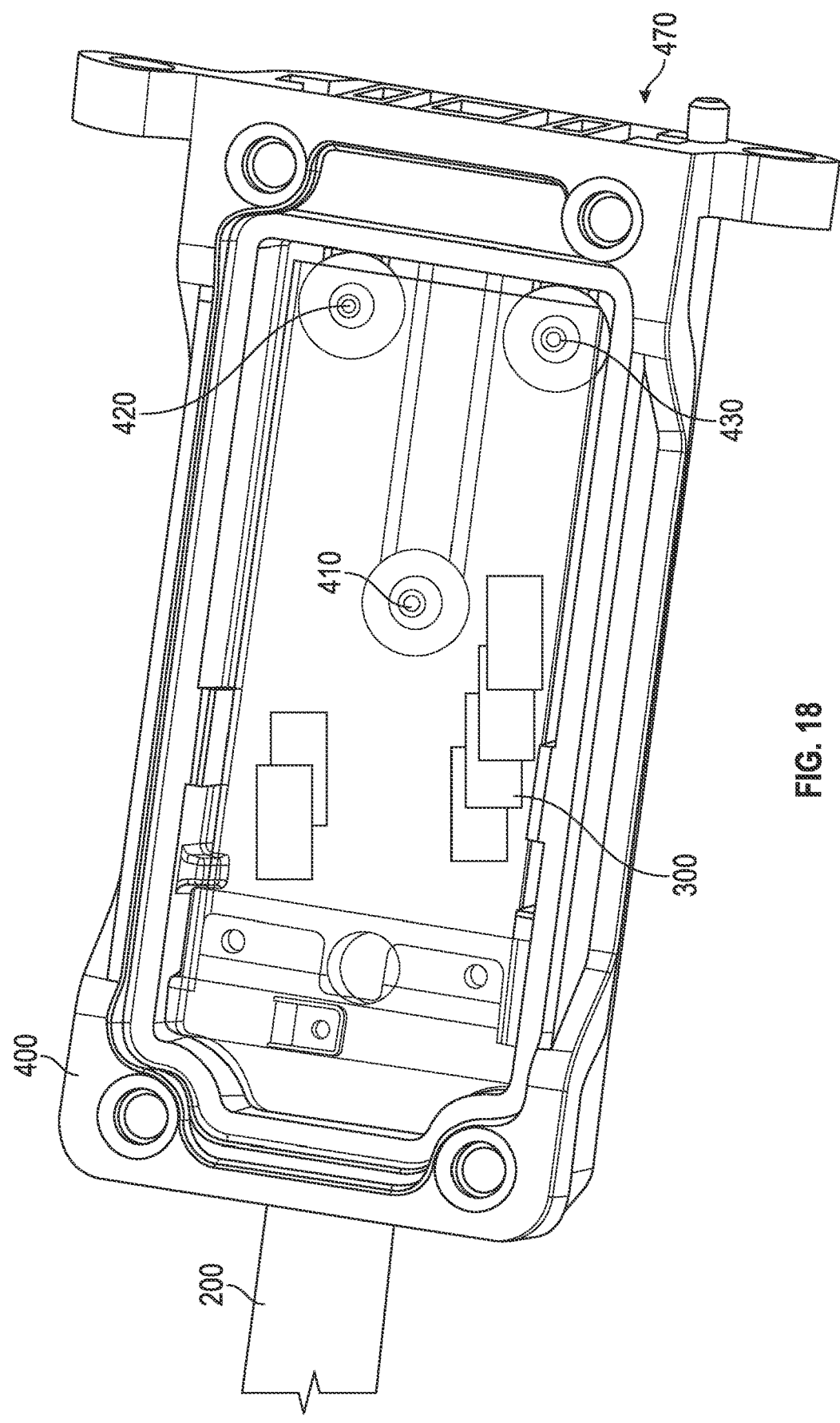
FIG. 18 is a perspective view of one of many embodiments of select components of a piezo valve assembly according to the disclosure.
Figure 19:
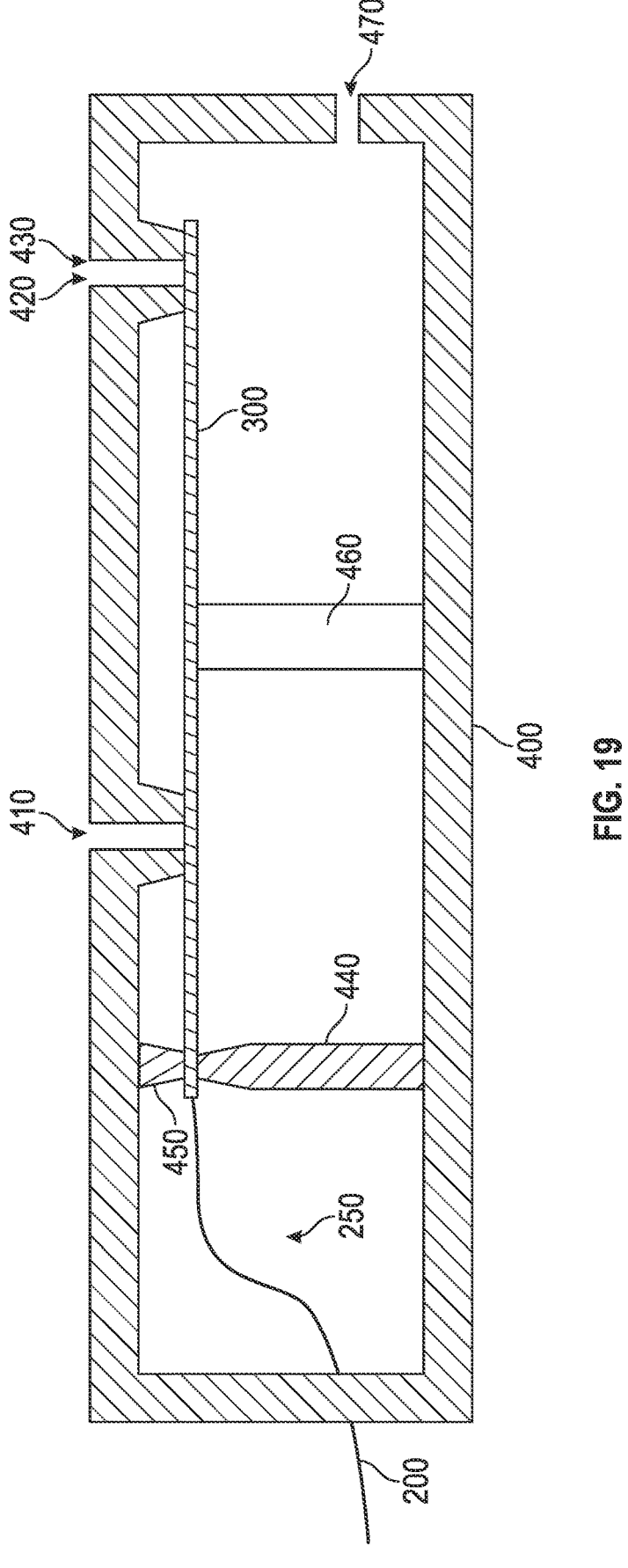
FIG. 19 is a first sectional schematic view of another one of many embodiments of select components of a piezo valve assembly according to the disclosure.
Figure 20:
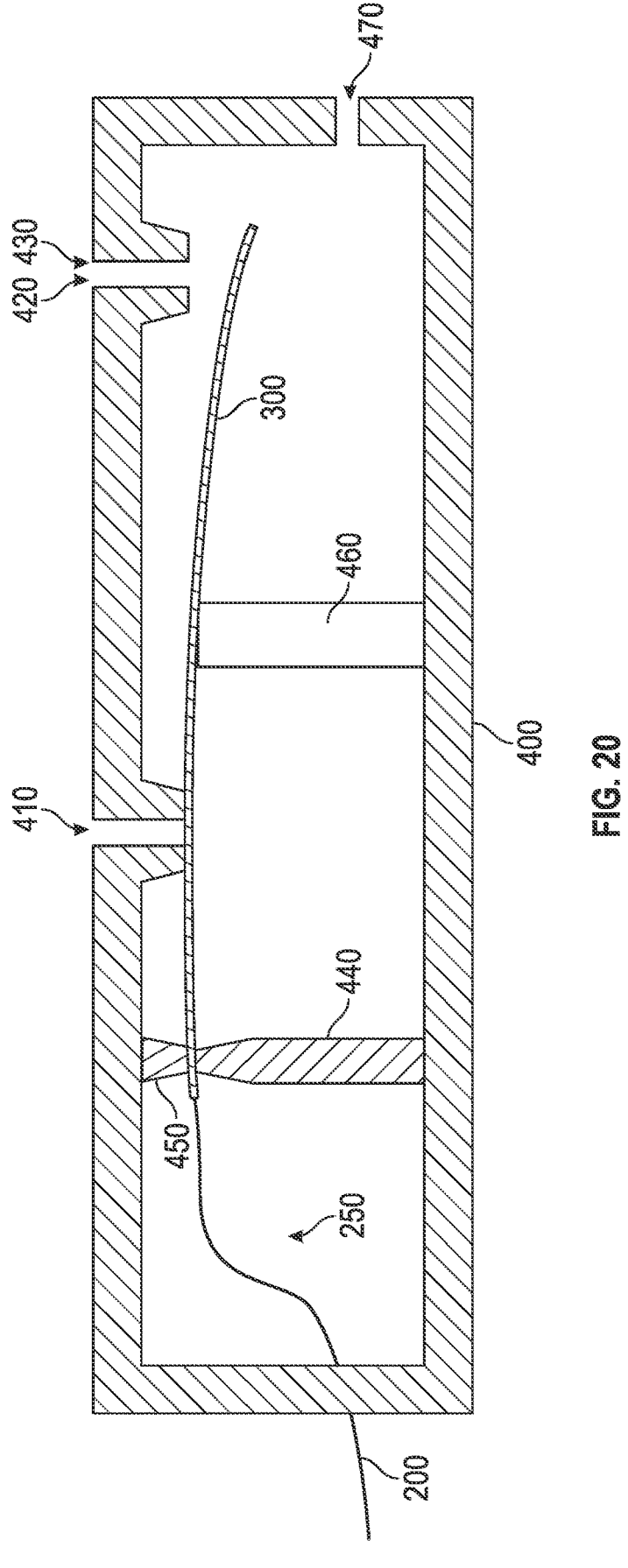
FIG. 20 is a second sectional schematic view of another one of many embodiments of select components of a piezo valve assembly according to the disclosure.
Figure 21:
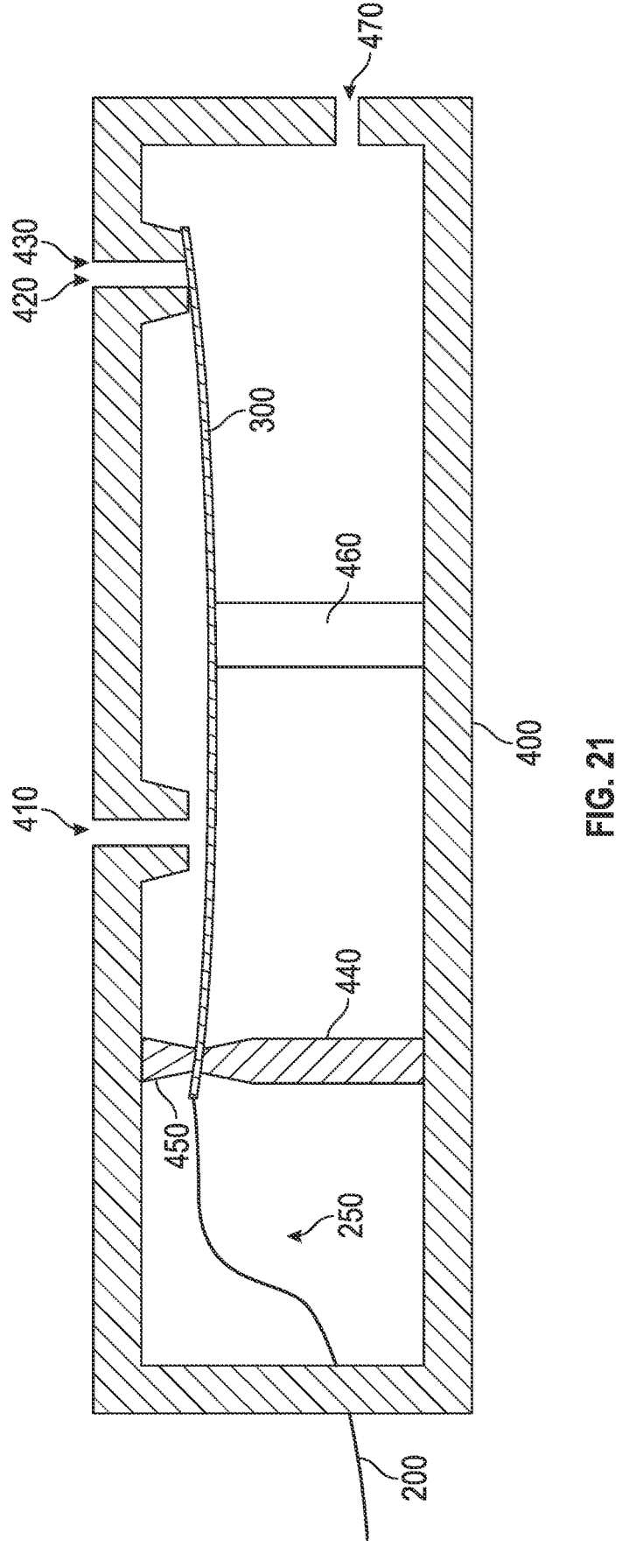
FIG. 21 is a third sectional schematic view of another one of many embodiments of select components of a piezo valve assembly according to the disclosure.

FIG. 1 is a first perspective view of one of many embodiments of select components of a piezo valve assembly according to the disclosure. FIG. 2 is a second perspective view of one of many embodiments of select components of a piezo valve assembly according to the disclosure. FIG. 3 is a third perspective view of one of many embodiments of select components of a piezo valve assembly according to the disclosure. FIG. 4 is a first side elevation view of one of many embodiments of select components of a piezo valve assembly according to the disclosure. FIG. 5 is a second side elevation view of one of many embodiments of select components of a piezo valve assembly according to the disclosure. FIG. 6 is a third side elevation view of one of many embodiments of select components of a piezo valve assembly according to the disclosure. FIG. 7 is a plan view of one of many embodiments of select components of a piezo valve assembly according to the disclosure. FIG. 8 is a first sectional perspective view of one of many embodiments of select components of a piezo valve assembly according to the disclosure. FIG. 9 is a second sectional perspective view of one of many embodiments of select components of a piezo valve assembly according to the disclosure. FIG. 10 is a first sectional schematic view of one of many embodiments of select components of a piezo valve assembly according to the disclosure. FIG. 11 is a second sectional schematic view of one of many embodiments of select components of a piezo valve assembly according to the disclosure. FIG. 12 is a third sectional schematic view of one of many embodiments of select components of a piezo valve assembly according to the disclosure. FIG. 13 is a flow chart of one of many embodiments of a method of assembling a piezo valve according to the disclosure. FIG. 14 is a plan view of one of many embodiments of a cable assembly according to the disclosure. FIG. 15 is a first side elevation view of one of many embodiments of select components of a piezo valve assembly according to the disclosure. FIG. 16 is a second side elevation view of one of many embodiments of select components of a piezo valve assembly according to the disclosure. FIG. 17 is a third side elevation view of one of many embodiments of select components of a piezo valve assembly according to the disclosure. FIG. 18 is a perspective view of one of many embodiments of select components of a piezo valve assembly according to the disclosure. FIG. 19 is a first sectional schematic view of another one of many embodiments of select components of a piezo valve assembly according to the disclosure. FIG. 20 is a second sectional schematic view of another one of many embodiments of select components of a piezo valve assembly according to the disclosure. FIG. 21 is a third sectional schematic view of another one of many embodiments of select components of a piezo valve assembly according to the disclosure. FIGS. 1-21 are described in conjunction with one another.

Applicants have created new and useful devices, systems and methods for piezo valves and the manufacture or assembly of piezo valves and/or of components for piezo valves. For instance, one or more embodiments of the disclosure can simplify aspects of the production process for piezo systems, such as by reducing the time or steps involved with assembly of two or more electrical components to one another and/or into a housing. As other examples, one or more embodiments of the disclosure can reduce the cost of one or more components for piezo systems and/or provide for advantageous tolerance compensation during system assembly. Aspects of the disclosure are described in further detail below with specific reference to the appended drawings.

In at least one embodiment, a piezo valve system 100 can include one or more piezo elements 300, such as a ceramic or other piezo bender for cooperating with one or more other components to control fluid flow through a valve or valve system. A piezo element 300 can include a first layer 310 and a second layer 320, and system 100 can further include a connector 202 having a first contact 212 and a second contact 222, a cable 200 having a first conductor 210 electrically coupled to the first contact 212 and a second conductor 220 electrically coupled to the second contact 222, or any combination thereof. In at least one embodiment, the second layer 320 can oppose the first layer 310. In at least one embodiment, an inner layer 360 can be positioned between the second layer 320 and the first layer 310. In at least one embodiment, the piezo element 300 can include an inner layer 360, which can be composed of ceramic or other piezo reactive material between the second layer 320 can oppose the first layer 310. In at least one embodiment, the piezo element 300 can deform along its length when a voltage difference is applied across the layers 310, 320.

In at least one embodiment, the piezo element 300 can deform in a first direction normal to its length when a positive voltage difference is applied to the first layer 310 relative to the second layer 320. In at least one embodiment, the piezo element 300 can deform in a second direction normal to its length when a negative voltage difference is applied to the first layer 310 relative to the second layer 320.

In at least one embodiment, the piezo element 300 can include two or more surfaces or layers 310, 320. In at least one embodiment, the piezo element 300 can include three layers 310, 320, 360. In at least one embodiment, first and second layers 310, 320 of the piezo element 300 can be conductive, with inner layer 360 being composed of ceramic or other piezo reactive material. In at least one embodiment, the inner layer 360 of the piezo element 300 can be conductive with the first and second layers 310, 320 being composed of ceramic or other piezo reactive material. In at least one embodiment, the first and second layers 310, 320 of the piezo element 300 can be composed of ceramic or other piezo reactive material with conductive outer surfaces. As will be appreciated by a person of ordinary skill in the art having the benefits of the present disclosure, in one or more examples of a piezo valve system presented herein for illustrative purposes, piezo element 300 can be configured for moving between or among three different positions (see, e.g., FIGS. 19-21, respectively), in which case piezo element 300 typically will include two layers of ceramic or other piezo reactive material for accomplishing such positioning. However, other configurations are possible for at least some implementations of the disclosure, including configurations wherein piezo element 300 includes only a single layer of ceramic or other piezo reactive material (e.g., for implementation wherein fewer than three positions are required or desired).

In at least one embodiment, the piezo element 300 can deform in a first direction normal to its length, when a positive voltage difference is applied to the first layer 310 relative to the second layer 320 and/or a second direction normal to its length when a positive voltage difference is applied to the inner layer 360 relative to the second layer 320. In at least one embodiment, the piezo element 300 can deform in a first direction normal to its length, when a negative voltage difference is applied to the first layer 310 relative to the second layer 320 and/or a second direction normal to its length when a negative voltage difference is applied to the inner layer 360 relative to the second layer 320.

In at least one embodiment, the second contact 222 can move from an initial position to a final position. In at least one embodiment, the first and second contacts 212, 222 can be coplanar in the initial position. In at least one embodiment, the first and second contacts 212, 222 can be disposed in different planes, with a pocket 240 there between, in the final position. In at least one embodiment, at least a portion of the piezo element 300 can be disposed within the pocket 240 of the connector 202 with the first contact 212 in electrical communication with the first layer 310 and the second contact 222 in electrical communication with the second layer 220.

In at least one embodiment, the connector 202 and the cable 200 can be integral parts of a unitary foil cable. In at least one embodiment, the piezo element 300 can be a ceramic piezo bender. In at least one embodiment, the connector 202 can include at least one arm 224 electrically coupled to the second conductor 220 and the second contact 222. In at least one embodiment, the at least one arm 224 can be disposed adjacent to a side of the piezo element 300. In at least one embodiment, the piezo element 300 can be soldered to the first and second contacts 212, 222 within the pocket 240. In at least one embodiment, the cable 200 can include a biasing portion 250 to bias the piezo element 300 in at least one direction. In at least one embodiment, the biasing portion 250 of the cable 200 can be elastomerically deformed, and thereby provide the biasing force. In at least one embodiment, the biasing portion 250 of the cable 200 can be elastomerically deformed into a compound curve. In at least one embodiment, the biasing portion 250 can abut a portion or surface (e.g., a stop surface), such as a shoulder 404 of a housing 400 of system 100.

In at least one embodiment, each layer/surface 310, 320, 360 of the piezo element 300 can be of identical dimensions. In at least one embodiment, the inner layer 360 can be thicker than the first and second layers 310, 320. In at least one embodiment, the inner layer 360 can be thinner than the first and second layers 310, 320. In at least one embodiment, one or both of the first and second layers 310, 320 can be shorter and/or narrower than the other first and second layer 310, 320 and/or the inner layer 360. For example, in at least one embodiment, the first layer 310 can be shorter and/or narrower than the second layer 320, and therefore does not extend into the pocket 240 as much as the first layer 310 and/or is spaced apart from the arms 224 of the second contact 222, thereby ensuring an air gap between the first conductive layer 310 and the second contact 222. In at least one embodiment, the first layer 310 can be shorter and/or narrower than the inner layer 360, and thereby provide space for the third contact 262 to connect to the inner layer 360. In at least one embodiment, the first contact 212 can include a tab, or stop, to abut the first layer 310, when the piezo element 300 is properly seated within the pocket 240.

In at least one embodiment, a piezo valve system 100 can include a housing 400, a support 440 configured to support at least one of the piezo element 300 and the connector 202, a stop surface 450 disposed within the housing 400, or any combination thereof. In at least one embodiment, the piezo element 300 can be disposed within the housing 400 and/or supported by the support 440, with the cable 200 in physical contact with the stop surface 450. In at least one embodiment, the support 440 and/or the stop surface 450 can comprise a set screw to permit adjustment and/or securement of the piezo element 300. In at least one embodiment, the support 440 and/or the stop surface 450 can include a seal, such as an O-ring, 442.

In at least one embodiment, the housing 400 can have at least two ports 410, 420, 430, 470. In at least one embodiment, the housing 400 can house the piezo element 300 in selective sealing communication with at least one of the ports 410, 420, 430. In at least one embodiment, each of the ports 410, 420, 430 includes a valve seat or seal 412, 422, 432, respectively. In at least one embodiment, the piezo element 300 includes a valve seat or seal 412, 422, 432 for each of the ports 410, 420, 430. In at least one embodiment, the housing 400 can include a spring, other biasing element, 460, which can be configured to bias the piezo element 300 towards the ports 410, 420, 430.

In at least one embodiment, the housing 400 can include a working port 470 coupled to an external diaphragm, valve, or other device, such as those to be actuated by the piezo valve system 100. When the piezo element 300 is actuated to open ports 420, 430, pneumatic pressure can be conveyed from ports 420, 430 through the working port 470, as shown in FIGS. 11 & 20 for example. When the piezo element 300 is relaxed, as shown in FIGS. 10 & 19 for example, pressure can be maintained at each of the ports 410, 420, 430, 470. When the piezo element 300 is actuated to open port 410, pneumatic pressure can be conveyed from the working port 470 through port 410, as shown in FIGS. 12 & 21 for example. At least because ports 420, 430 are positioned near an end of the piezo element 300, opening of ports 420, 430 can be especially rapid. While the present embodiment is described in the context of a pneumatic implementation for illustrative purposes, such an embodiment is but one of many and it will be understood that other implementations of the disclosure are also possible (e.g., hydraulic implementations).

In at least one embodiment, any of the ports 410, 420, 430 can be aligned along a longitudinal axis of the housing 400. In at least one embodiment, any of the ports 410, 420, 430 can be aligned across a longitudinal axis of the housing 400. For example, in at least one embodiment, the second and third ports 420, 430 can be aligned across a longitudinal axis of the housing 400, but spaced along the longitudinal axis of the housing 400 from the first port 410. In at least one embodiment, flexure of the piezo bender element 300 can open and/or close any combination of the ports 410, 420, 430. In at least one embodiment, any of the ports 410, 420, 430 can be positioned above or below the piezo bender element 300. In at least one embodiment, one or more of the ports 410, 420, 430 can be positioned above the piezo bender element 300 while one or more of the ports 410, 420, 430 can be positioned below the piezo bender element 300.

In at least one embodiment, a portion of the cable 200 disposed between the stop surface 450 and the support 440 can be bent into a biasing portion 250 of the cable 200. In at least one embodiment, the biasing portion 250 can bias the piezo element 300 away from the stop surface 450.

In at least one embodiment, a piezo valve system 100 can include one or more stops 402 disposed within the housing 400. In at least one embodiment, the biasing portion 250 of the cable 200 can bias at least a portion of the piezo element 300 towards the one or more stops 402. In at least one embodiment, the biasing portion 250 of the cable 200 can bias at least a portion of the connector 202 towards the one or more stops 402. In at least one embodiment, the biasing portion 250 of the cable 200 can bias at least a portion of the connector 202 towards the one or more stops 402 disposed on a side of the housing 400 opposite a stop surface or shoulder 404. In at least one embodiment, the biasing portion 250 of the cable 200 can bias at least a portion of the connector 202 into physical contact with at least one of the one or more stops 402. In at least one embodiment, the biasing portion 250 of the cable 200, the stop surface 404 and the one or more stops 402 can cooperate to hold the connector 202 and the piezo element 300 in place within the housing 400.

In at least one embodiment, the biasing portion 250 of the cable 200 can abut the shoulder 404 of the housing 400. In at least one embodiment, shoulders 214 of the connector 202 can contact the stop surface 404, and thereby hold the connector 202 and the piezo element 300 in place within the housing 400. In at least one embodiment, the second contact 222 can contact one or more of the stops 402, and thereby hold the connector 202 and the piezo element 300 in place within the housing 400. In at least one embodiment, the connector 202, the stops 402, and the shoulder 404 of the housing 400 can cooperate to hold the connector 202 and the piezo element 300 in place within the housing 400.

In at least one embodiment, an electrical cable 200 for a piezo bender 300 can include a first conductor 210 electrically coupled to a first contact 212 and a second conductor 220 electrically coupled to a second contact 222. In at least one embodiment, the cable 200 can include a third conductor 260 coupled to a third contact 262. In at least one embodiment, the conductors 210, 220, 260 and the contacts 212, 222, 262 can be electrically insulated from each other. For example, in at least one embodiment, the cable 200 can include one or more insulators 230 to insulate any of the conductors 210, 220, 260 and the contacts 212, 222, 262 from each other. In at least one embodiment, the conductors 210, 220, 260 can be stacked, one on top of another, with insulators 230 therebetween. In at least one embodiment, the conductors 210, 220, 260 can be traces next to one another, with insulators 230 therebetween.

In at least one embodiment, the first and second contacts 212, 222 can have a first position and a second position. In at least one embodiment, the first and second contacts 212, 222 can be coplanar in the first position. In at least one embodiment, the first and second contacts 212, 222 can be disposed in different planes in the second position. In at least one embodiment, the third contact 262 can remain in relative position with respect to the first contact 212, as the second contact 222 moves between the first position and the second position. In at least one embodiment, the third contact 262 can move with the second contact 222, relative to the first contact 212, as the second contact 222 moves between first position and the second position.

In at least one embodiment, at least one of the first and second contacts 212, 222 can be configured to be plastically deformed relative to the other of the first and second contacts 212, 222. In at least one embodiment, the first and second contacts 212, 222 can be configured to form a pocket 240 therebetween, such as when the first and second contacts 212, 222 are in the second position. In at least one embodiment, the piezo bender 300 can have a first portion and a second portion. In at least one embodiment, the pocket 240 can receive at least the first portion of the piezo bender 300, such as to support electrical communication between the first and second contacts 212, 222 and one or more layers 310, 320, 360 of the piezo bender 300. In at least one embodiment, the second contact 222 can be positioned below the first contact 212 and/or the third contact 262, when in the second position with the pocket 240 therebetween. In at least one embodiment, the second contact 222 can be positioned above the first contact 212 and/or the third contact 262, when in the second position with the pocket 240 therebetween.

In at least one embodiment, a method 500 for assembling a piezo valve 100 can include providing a cable 200 having first and second contacts 212, 222, such as shown in step 502. In at least one embodiment, the cable 200 can have first and second conductors 210, 220 in electrical communication with the first and second contacts 212, 222.

In at least one embodiment, method 500 can include forming a pocket 240 between the first and second contacts 212, 222, such as shown in step 504. In at least one embodiment, forming the pocket 240 between the first and second contacts 212, 222 can include moving the second contact 222 from a first position to a second position. In at least one embodiment, forming the pocket 240 further can include bending an arm 224 electrically coupled between the second conductor 220 and the second contact 222. In at least one embodiment, the first and second contacts 212, 222 can be coplanar in the first position. In at least one embodiment, the second contact 222 can be distal of the first contact 212, in the first position. In at least one embodiment, the first and second contacts 212, 222 can be disposed in different planes in the second position. In at least one embodiment, the first and second contacts 212, 222 can be disposed in parallel planes in the second position.

In at least one embodiment, method 500 can include inserting at least a portion of a piezo element 300 into the pocket 240, such as shown in step 506. In at least one embodiment, inserting at least a portion of the piezo element 300 can comprise sliding the piezo element 300 between and/or parallel to the first and/or second contacts 212, 222.

In at least one embodiment, method 500 can include electrically coupling the first contact 212 to a first layer 310 of the piezo element 300, such as shown in step 508. In at least one embodiment, method 500 can include electrically coupling the second contact 222 to a second layer 320 of the piezo element 300, such as shown in step 508. In at least one embodiment, electrically coupling the first contact 212 to the first layer 310 and/or electrically coupling the second contact 222 to the second layer 320 can include soldering the first contact 212 to the first layer 310 and/or soldering the second contact 222 to the second layer 320. In at least one embodiment, the second layer 320 of the piezo element 300 can oppose the first layer 310.

In at least one embodiment, method 500 include routing the cable 200 through a housing 400, such as shown in step 510. In at least one embodiment, method 500 can include positioning the piezo element 300 in the housing 400, such as shown in step 512.

In at least one embodiment, method 500 can include disposing the piezo element 300 within a housing 400 of the piezo valve 100, routing an end of the cable 200 for electrical communication with a power source, contacting a stop surface 404 with the cable 200, bending a portion of the cable 200 disposed between the stop surface 404 and at least one of the first and second contacts 212, 222, thereby creating a biasing portion 250 of the cable 200, or any combination thereof. In at least one embodiment, method 500 can include disposing at least a portion of one of the first and second contacts 212, 222 between the stop surface 404 and one or more stops 402 disposed within the housing 400 and/or biasing at least one of the first and second contacts 212, 222 towards the one or more stops 402 with the biasing portion 250 of the cable 200. In at least one embodiment, method 500 can include biasing the piezo element 300 away from the stop surface 404 with the biasing portion 250 of the cable 200 and/or electrically coupling at least one of the first and second contacts 212, 222 to the piezo element 300 while the piezo element 300 is biased away from the stop surface 404. In at least one embodiment, method 500 can include biasing the second contact 222 into a rest position against the one or more stops 402.

In at least one embodiment, a method for assembling a piezo valve can include providing a cable having first and second contacts, forming a pocket between the first and second contacts, inserting at least a portion of a piezo element into the pocket, electrically coupling the first contact to a first layer of the piezo element, electrically coupling the second contact to a second layer of the piezo element, or any combination thereof. In at least one embodiment, the cable can have first and second conductors in electrical communication with the first and second contacts.

In at least one embodiment, forming the pocket between the first and second contacts can include moving the second contact from a first position to a second position. In at least one embodiment, the first and second contacts can be coplanar in the first position. In at least one embodiment, the first and second contacts can be disposed in different planes in the second position. In at least one embodiment, forming the pocket further can include bending an arm electrically coupled between the second conductor and the second contact.

In at least one embodiment, the second layer of the piezo element can oppose the first layer. In at least one embodiment, inserting at least a portion of the piezo element can comprise sliding the piezo element between and/or parallel to the first and/or second contacts. In at least one embodiment, electrically coupling the first contact to the first layer and/or electrically coupling the second contact to the second layer can include soldering the first contact to the first layer and/or soldering the second contact to the second layer.

In at least one embodiment, a method for assembling a piezo valve can include disposing the piezo element within a housing of the piezo valve, routing an end of the cable for electrical communication with a power source, contacting a stop surface with the cable, bending a portion of the cable disposed between the stop surface and at least one of the first and second contacts, thereby creating a biasing portion of the cable, or any combination thereof. In at least one embodiment, a method for assembling a piezo valve can include disposing at least a portion of one of the first and second contacts between the stop surface and one or more stops disposed within the housing and/or biasing at least one of the first and second contacts towards the one or more stops with the biasing portion of the cable. In at least one embodiment, a method for assembling a piezo valve can include biasing the piezo element away from the stop surface with the biasing portion of the cable and/or electrically coupling at least one of the first and second contacts to the piezo element while the piezo element is biased away from the stop surface. In at least one embodiment, a method for assembling a piezo valve can include biasing the second contact into a rest position against the one or more stops. In at least one embodiment, a method for assembling a piezo valve can include electrically coupling a third contact of the cable to an inner layer of the piezo element.

In at least one embodiment, a piezo valve system can include a piezo element having a first layer and a second layer, a connector having a first contact and a second contact, a cable having a first conductor electrically coupled to the first contact and a second conductor electrically coupled to the second contact, or any combination thereof. In at least one embodiment, the second layer can oppose the first layer. In at least one embodiment, the piezo element can deform along its length when a voltage difference is applied across the layers. In at least one embodiment, the second contact can move from an initial position to a final position. In at least one embodiment, the first and second contacts can be coplanar in the initial position. In at least one embodiment, the first and second contacts can be disposed in different planes, with a pocket there between, in the final position. In at least one embodiment, at least a portion of the piezo element can be disposed within the pocket of the connector with the first contact in electrical communication with the first layer and the second contact in electrical communication with the second layer.

In at least one embodiment, the connector and the cable can be integral parts of a unitary foil cable. In at least one embodiment, the piezo element can be a ceramic piezo bender. In at least one embodiment, the piezo element can include an inner layer between the first layer and the second layer. In at least one embodiment, the connector can include a third contact, which can be electrically coupled to a third conductor of the cable. In at least one embodiment, the third contact of the connector can be electrically coupled to the inner layer of the piezo element when the portion of the piezo element is disposed within the pocket of the connector. In at least one embodiment, the connector can include at least one arm electrically coupled to the second conductor and the second contact. In at least one embodiment, the at least one arm can be disposed adjacent to a side of the piezo element. In at least one embodiment, the piezo element can be soldered to the first and second contacts within the pocket. In at least one embodiment, the cable can include a biasing portion to bias the piezo element in at least one direction.

In at least one embodiment, a piezo valve system can include a housing, a support configured to support at least one of the piezo element and the connector, a stop surface disposed within the housing, or any combination thereof. In at least one embodiment, the piezo element can be disposed within the housing and/or supported by the support, with the cable in physical contact with the stop surface. In at least one embodiment, the housing can have at least two ports. In at least one embodiment, the housing can house the piezo element in selective sealing communication with at least one of the ports. In at least one embodiment, a portion of the cable disposed between the stop surface and the support can be bent into a biasing portion of the cable. In at least one embodiment, the biasing portion can bias the piezo element away from the stop surface.

In at least one embodiment, a piezo valve system can include one or more stops disposed within the housing. In at least one embodiment, the biasing portion of the cable can bias at least a portion of the piezo element towards the one or more stops. In at least one embodiment, the biasing portion of the cable can bias at least a portion of the connector towards the one or more stops. In at least one embodiment, the biasing portion of the cable can bias at least a portion of the connector towards the one or more stops disposed on a side of the housing opposite a stop surface. In at least one embodiment, the biasing portion of the cable can bias at least a portion of the connector into physical contact with at least one of the one or more stops. In at least one embodiment, the biasing portion of the cable, the stop surface and the one or more stops can cooperate to hold the connector and the piezo element in place within the housing.

In at least one embodiment, an electrical cable for a piezo bender can include a first conductor electrically coupled to a first contact and a second conductor electrically coupled to a second contact. In at least one embodiment, the first conductor and the first contact can be electrically insulated from the second conductor and the second contact. In at least one embodiment, the first and second contacts can have a first position and a second position. In at least one embodiment, the first and second contacts can be coplanar in the first position. In at least one embodiment, the first and second contacts can be disposed in different planes in the second position.

In at least one embodiment, at least one of the first and second contacts can be configured to be plastically deformed relative to the other of the first and second contacts. In at least one embodiment, the first and second contacts can be configured to form a pocket therebetween, such as when the first and second contacts are in the second position. In at least one embodiment, the piezo bender can have a first portion and a second portion. In at least one embodiment, the pocket can receive at least the first portion of the piezo bender, such as to support electrical communication between the first and second contacts and one or more layers of the piezo bender.

Other and further embodiments utilizing one or more aspects of the disclosure can be devised without departing from the spirit of Applicants' disclosure. For example, the devices, systems and methods can be implemented for numerous different types and sizes in numerous different industries. Further, the various methods and embodiments of the devices, systems and methods can be included in combination with each other to produce variations of the disclosed methods and embodiments. Discussion of singular elements can include plural elements and vice-versa. The order of steps can occur in a variety of sequences unless otherwise specifically limited. The various steps described herein can be combined with other steps, interlineated with the stated steps, and/or split into multiple steps. Similarly, elements have been described functionally and can be embodied as separate components or can be combined into components having multiple functions.

The inventions have been described in the context of preferred and other embodiments and not every embodiment of the inventions has been described. Obvious modifications and alterations to the described embodiments are available to those of ordinary skill in the art having the benefits of the present disclosure. The disclosed and undisclosed embodiments are not intended to limit or restrict the scope or applicability of the inventions conceived of by the Applicants, but rather, in conformity with the patent laws, Applicants intend to fully protect all such modifications and improvements that come within the scope or range of equivalents of the following claims.

What is claimed is:

1. A method for assembling a piezo valve, the method comprising:
   providing a cable having first and second conductors and first and second contacts in electrical communication with the first and second conductors, respectively;
   forming a pocket between the first and second contacts by moving the second contact from a first position, in which the first and second contacts are coplanar, to a second position, in which the first and second contacts are disposed in different planes;
   inserting at least a portion of a piezo element into the pocket;
   electrically coupling the first contact to a first layer of the piezo element; and
   electrically coupling the second contact to a second layer of the piezo element, the second layer opposing the first layer.

2. The method of claim 1, wherein forming the pocket further comprises bending an arm electrically coupled between the second conductor and the second contact.

3. The method of claim 1, wherein inserting at least a portion of the piezo element comprises sliding the piezo element between and parallel to the first and second contacts.

4. The method of claim 1, wherein electrically coupling the first contact to the first layer and electrically coupling the second contact to the second layer comprises soldering the first contact to the first layer and soldering the second contact to the second layer.

5. The method of claim 1, further comprising:

disposing the piezo element within a housing of the piezo valve and routing an end of the cable for electrical communication with a power source;

contacting a stop surface with the cable; and bending a portion of the cable disposed between the stop surface and at least one of the first and second contacts, thereby creating a biasing portion of the cable.

6. The method of claim 5, further comprising:

disposing at least a portion of one of the first and second contacts between the stop surface and one or more stops disposed within the housing; and biasing at least one of the first and second contacts towards the one or more stops with the biasing portion of the cable.

7. The method of claim 6, further comprising biasing the second contact into a rest position against the one or more stops.

8. The method of claim 1, further comprising electrically coupling a third contact of the cable to an inner layer of the piezo element.

9. A piezo valve system, comprising:

a piezo element having a first layer and a second layer, the second layer opposing the first layer;

a connector having a first contact and a second contact, the second contact being configured to move from an initial position, in which the first and second contacts are coplanar, to a final position, in which the first and second contacts are disposed in different planes with a pocket there between; and a cable having a first conductor electrically coupled to the first contact and a second conductor electrically coupled to the second contact;

wherein at least a portion of the piezo element is disposed within the pocket of the connector with the first contact in electrical communication with the first layer and the second contact in electrical communication with the second layer.

10. The system of claim 9, wherein the connector and the cable are integral parts of a unitary foil cable.

11. The system of claim 9, wherein the piezo element includes an inner layer between the first layer and the second layer and wherein a third contact of the connector is electrically coupled to a third conductor of the cable and electrically coupled to the inner layer of the piezo element when the portion of the piezo element is disposed within the pocket of the connector.

12. The system of claim 9, further comprising at least one arm electrically coupled to the second conductor and the second contact, wherein the at least one arm is disposed adjacent to a side of the piezo element.

13. The system of claim 9, wherein the piezo element is soldered to the first and second contacts within the pocket.

14. The system of claim 9, wherein the cable further comprises a biasing portion configured to bias the piezo element in at least one direction.

15. The system of claim 9, further comprising:

a housing having at least two ports and configured to house the piezo element in selective sealing communication with at least one of the ports;

a support configured to support at least one of the piezo element and the connector; and a stop surface disposed within the housing;

wherein the piezo element is disposed within the housing and supported by the support, with the cable in physical contact with the stop surface.

16. The system of claim 15, wherein a portion of the cable disposed between the stop surface and the support is bent into a biasing portion of the cable configured to bias the piezo element away from the stop surface.

17. The system of claim 16, further comprising one or more stops disposed within the housing, wherein the biasing portion of the cable is configured to bias at least a portion of the piezo element towards the one or more stops.

18. The system of claim 16, further comprising one or more stops disposed within the housing, wherein the biasing portion of the cable is configured to bias at least a portion of the connector towards the one or more stops.

19. The system of claim 16, further comprising one or more stops disposed within the housing, wherein the biasing portion of the cable is configured to bias at least a portion of the connector into physical contact with at least one of the one or more stops.

20. The system of claim 16, wherein the biasing portion of the cable is configured to bias the connector towards one or more stops disposed on a side of the housing opposite a stop surface, and wherein the biasing portion of the cable, the stop surface and the one or more stops are configured to cooperate to hold the connector and the piezo element in place within the housing.

* * * * *